United States Patent [19]
Kelly

[11] Patent Number: 5,819,582
[45] Date of Patent: *Oct. 13, 1998

[54] SLOW WAVE TIME-DOMAIN REFLECTOMETER POINT LEVEL SENSOR

[76] Inventor: John M. Kelly, 9 Canon Ridge, Fairport, N.Y. 14450

[*] Notice: This patent issued on a continued prosecution application filed under 37 CFR 1.53(d), and is subject to the twenty year patent term provisions of 35 U.S.C. 154(a)(2).

[21] Appl. No.: 829,601

[22] Filed: Mar. 31, 1997

[51] Int. Cl.$^6$ .............................. G01F 23/00; G01R 27/04
[52] U.S. Cl. ......................... 73/290 R; 324/642; 324/643
[58] Field of Search .............................. 73/290 R, 304 R; 324/642, 643

[56] References Cited

U.S. PATENT DOCUMENTS

| | | | |
|---|---|---|---|
| 3,703,829 | 11/1972 | Dougherty | 73/290 R |
| 3,812,422 | 5/1974 | DeCarolis | 324/58.5 B |
| 3,822,900 | 7/1974 | Ross . | |
| 3,853,005 | 12/1974 | Schendel | 73/290 R |
| 3,922,914 | 12/1975 | Fuchs . | |
| 3,995,212 | 11/1976 | Ross | 73/290 R X |
| 4,135,397 | 1/1979 | Krake | 73/290 R |
| 4,489,601 | 12/1984 | Rao et al. | 73/290 R |
| 4,797,621 | 1/1989 | Anderson et al. . | |
| 4,949,076 | 8/1990 | Wann . | |
| 5,249,463 | 10/1993 | Willson et al. | 73/290 R |
| 5,376,888 | 12/1994 | Hook | 324/643 |
| 5,400,651 | 3/1995 | Welch . | |
| 5,554,936 | 9/1996 | Mohr | 324/642 |
| 5,609,059 | 3/1997 | McEwan | 73/290 R |
| 5,651,286 | 7/1997 | Champion et al. | 73/290 V |
| 5,656,774 | 8/1997 | Nelson et al. | 73/290 |

OTHER PUBLICATIONS

Lindström et al, "A New Instrument for the Measurement of Liquid Level," Rev. of Sci. Inst, vol. 41, pp. 1083–1087 (Jul., 1970).

Primary Examiner—Hezron E. Williams
Assistant Examiner—Jay L. Politzer

[57] ABSTRACT

Slow wave, time-domain reflectometer based point level sensors and instruments. Such sensors and instruments include a transmission line having an inner conductor, an outer shield that extends over that inner conductor so as to define a gap between the inner conductor and the outer shield, a dielectric material that fills the gap, except at a point, thereby defining a space, and an access opening for enabling a material being sensed to fill the space when that material is present. According to the invention the dielectric material has a permittivity substantially different from the material being sensed. Further included are a pulse generator for generating pulses on the transmission line, and a processing unit for determining whether the material being sensed fills the space. Beneficially the inner conductor is helically wound around a core, creating a slow wave transmission line.

20 Claims, 1 Drawing Sheet

SLOW WAVE TIME-DOMAIN REFLECTOMETER POINT LEVEL SENSOR

FIELD OF THE INVENTION

This invention relates to material interface sensing. More particularly, it relates to the use of time domain reflectometry for material interface sensing. Even more particularly, this invention relates to point level time domain reflectometry material interface sensing of materials having different permittivities or permeabilities.

BACKGROUND OF THE INVENTION

It is often necessary to determine whether the surface of a liquid is at or above a particular level, sometimes even when that surface is below another liquid. This type of measurement is called point level sensing. Numerous types of point level sensors are known in the prior art. For example, floats are frequently used in conjunction with switches that are placed at fixed positions in a tank. When the float reaches the level of a switch that switch is activated. Floats can be designed to sense the position of an interface between two liquids. In that case the floatation of the float is controlled such that the float rises in one liquid, but sinks in the other.

While floats are useful, their operation depends upon mechanical movement and upon the density or densities of one or more liquids. This is a disadvantage in some applications. For example, if the density of a liquid is not known, or if it changes, the position of the interface may not be accurately sensed. Furthermore, floats are often rather large and are subject to leaks and other failures.

Many other types of point level sensing systems are known, including ultrasonic, radiation detection, thermal conductivity, and paddle wheels. However, some of these systems are expensive, some are inaccurate, some are subject to clogging, and others are difficult to use, particularly when attempting to sense the interface between two liquids. Indeed, with some liquids, such as water and oil, the interface may not be well defined.

Another type of material level sensing system, one that may not have ever been used for simple point level sensing, uses time domain reflectometry. For example, U.S. Pat. No. 3,832,900, issued on 2 Sep. 1974 to Ross and entitled "Apparatus and Method for Measuring the Level of a Contained Liquid" describes a time domain material level sensing system that measures the level of a liquid, even if that liquid sinks below another liquid. While the Ross system is essentially continuous in that the level of the liquid is sensed over a large span, by the use of timing pulses, and by assuming that the velocity of pulses on the transmission line is known, the liquid level can be compared to a predetermined position and a point level sensor could be implemented.

In practice prior art time domain reflectometry material level sensing systems such as in Ross have problems with regards to their use for point level sensing. First, they are relatively expensive to implement since the time domain reflectometry pulse velocity is so high that extremely narrow pulses and an accurate method of resolving short times are required. Second, the Ross system is not a true a point level system in that the location of the liquid relative to a predetermined point is derived by assuming a pulse velocity. While an assumed pulse velocity may be acceptable when the dielectric or dielectrics between the inner wire and the outer shield are known, in many applications that dielectric is not well known.

One solution to the problems related to high pulse velocities is provided by K. Lindstrom, H. Kjellander, and C. Johnson in "A New Instrument for the Measurement of Liquid Level," *The Review of scientific Instruments*, pages 1083–87, Volume 41, number 7, July 1970. That article describes a liquid level monitoring instrument in which electromagnetic pulses are impressed on a transmission line comprised of a helical wound inner conductor and a conductive outer shield that is spaced apart from the inner conductor such that a liquid can become between the inner conductor and the outer shield. Transmission lines having a wound conductor and a spaced-apart ground conductor are slow wave transmission lines in that the axial pulse propagation velocity is much slower than the velocity of pulse propagation in free space (which is about 300,000,000 meters per second). While common transmission lines have pulse velocities much less than 300,000,000 meters per second because they replace air with another dielectric material they still have relatively high pulse velocities (in the 200,000,000 meters per second range). However, Lindstrom et al. reported a pulse speed of about 650,000 meters per second for their wound transmission line and I have wound slow wave transmission lines with even slower pulse velocities.

In the Lindstrom et al. article their transmission line is inserted into a tank which holds a liquid whose level is being monitored. The time required for a pulse to be generated and impressed on the transmission line, to travel down that line, to reflect off of the interface between the liquid and a gas which fills the remainder of the wound transmission line, and to return to the point of impression is used to determine the position of the liquid-gas interface.

While slow wave transmission lines simplify the difficulty of resolving distances to material interfaces by slowing the axial velocity of their pulses, slow wave transmission lines still have their problems for point level sensing. For example, since the pulse velocity along a slow wave transmission line depends upon the permittivity and permeability of the material or materials that fill that line, and since the air-water interface position is determined from the pulse propagation velocity, changes in material characteristics significantly affect the level determination. Another problem is that the speed of a pulse along a slow wave transmission line is not uniform. This can be deduced from Lindstrom et al's statements regarding inaccuracies when the liquid-air interface is within either 15 centimeters of the top or 5 centimeters of the bottom of their line. The final problem to be noted is that since the windings of a slow wave transmission line form an inductor, and since the inductance of an inductor is known to be age and temperature sensitive, the pulse speed cannot safely be assumed over time and temperature.

Given the above limitations and problems, a technique of using slow wave transmission lines for point level sensing would be beneficial. Even more beneficial would be a slow wave, time-domain reflectometry based point level sensor which could sense the interface between two liquids. Particularly beneficial would be a slow wave, time domain reflectometer point level sensor that could be implemented at relatively low cost. Even more beneficially would be a slow wave transmission line, time domain reflectometer point level sensor that is relatively insensitive to changes in the liquid being sensed and/or to changes in a liquid, such as oil, that floats on another liquid such as water. Finally, a slow wave transmission line, time domain reflectometer point level sensor that does not depend upon timing pulses to determine the distance of a reflection causing interface would be useful.

The following references may be helpful in better understanding transmission lines and time domain reflectometry systems which use them: U.S. Pat. No. 3,296,862 entitled, "FLUID LEVEL MEASURING APPARATUS," issued to Ziniuk on 10 Jan. 1967; U.S. Pat. No. 3,424,002, entitled, "APPARATUS FOR THE DETERMINATION OF LOCATION OF INTERFACES BETWEEN DIFFERENT MATERIALS," issued to Johnson on 28 Jan. 1969; K. Lindstrom, H. Kjellander, and C. Johnson in "A NEW INSTRUMENT FOR THE MEASUREMENT OF LIQUID LEVEL," *The Review of Scientific Instruments*, pages 1083–87, Volume 41, number 7, Jul. 1970; U.S. Pat. No. 3,695,107, entitled, "METHOD OF MEASURING THE LEVEL OF A MATERIAL IN A TANK, AND AN APPARATUS FOR PRACTICING THIS METHOD," issued to Hertz and Lindstrom on 3 Oct. 1972; U.S. Pat. No. 3,703,829, entitled, "LIQUID QUANTITY GAUGING SYSTEM," issued to Dougherty on 28 Nov. 1972, note his discussion of variable winding density and his discussion of the use of ferromagnetic sleeves; U.S. Pat. No. 3,812,422, entitled, "APPARATUS FOR MEASURING THE LEVELS OF FLUIDS AND THE DIELECTRIC CONSTANTS OF THE SAME," issued to De Carolis on 21 May 1974, specifically note his use of a perforated steel outer shield and a steel inner conductor; U.S. Pat. No. 3,853,005 entitled, "INTERFACE MEASURING APPARATUS," issued to Schendel on 10 Dec. 1974; U.S. Pat. No. 3,874,237, entitled, "LIQUID LEVEL HEIGHT MEASURING APPARATUS," issued to Zwarts on 1 Apr. 1975, specifically note the use of a perforated outer shield, albeit without a wound inner conductor; U.S. Pat. No. 3,965,416, entitled, "DIELECTRIC CONSTANT MEASURING APPARATUS," issued to Friedman on 22 Jun. 1976; U.S. Pat. No. 3,995,212 entitled, "APPARATUS AND METHOD FOR SENSING A LIQUID WITH A SINGLE WIRE TRANSMISSION LINE," issued to Ross on 30 Nov. 1976; U.S. Pat. No. 4,006,637 entitled, "ELECTRO-MECHANICAL, DISPLACEMENT TRANSDUCER," issued to Kinosita on 8 Feb. 1977; U.S. Pat. No. 4,786,857, entitled, "METHOD AND APPARATUS FOR TIME DOMAIN REFLECTOMETRY DETERMINATION OF RELATIVE PROPORTION, FLUID INVENTORY, AND TURBULENCE," issued to Mohr et al. on 22 Nov. 1988; U.S. Pat. No. 4,807,471, entitled, "LEVEL MEASUREMENT FOR STORAGE SILOS" issued to Cournane et al. on 28 Feb. 1989; and U.S. Pat. No. 4,924,700, entitled, "APPARATUS FOR MEASURING STORAGE PARAMETERS SUCH AS LEVEL AND TEMPERATURE OF LIQUIDS OR FLUIDS OF DIFFERENT DENSITIES IN A TANK," issued to Habart on 15 May 1990.

SUMMARY OF THE INVENTION

The principles of the present invention provide for time-domain reflectometer based point level sensors and instruments that use such sensors. Sensors and instruments in accord with the present invention can be implemented to sense the interface between two material, such as between a liquid and a gas or such as between two liquids, for example, oil and water. Further, they can be designed to be relatively insensitive to changes in the material(s) being sensed.

A device in accord with the principles of the present invention is comprised of a transmission line having an elongated inner conductor, an outer shield that extends over the inner conductor so as to define a gap between the inner conductor and the outer shield, a dielectric material that fills the gap, except at at least one point to be sensed, thereby defining a space in the transmission line, an access opening for enabling a material being sensed to fill the space when that material is present, wherein the dielectric material has a permittivity or permeability substantially different than the material being sensed. A device according to the principles of the present invention further includes a pulse source for generating pulses that propagate along the transmission line and a comparator for determining whether the material being sensed fills the space. Beneficially the inner conductor is helically wound so as to create a slow wave transmission line. Even more beneficially the comparator senses the reflection of the pulse from the space.

A point level sensor according to the principles of the present invention is comprised of a transmission line having an elongated, wound inner conductor, an outer shield that extends over the wound inner conductor so as to define a gap between the wound inner conductor and the outer shield, a dielectric material that fills the gap, except at a point to be sensed, thereby defining a space in the transmission line, an access opening for enabling a material being sensed to fill the space when that material is present, wherein the dielectric material has a permittivity substantially different than the material being sensed. Such a point level sensor further includes a pulse generator for generating pulses on the transmission line, a receiver for receiving echoes from disturbances on the transmission line, and a processing unit for determining from the received echoes whether the material being sensed fills the space.

BRIEF DESCRIPTION OF THE DRAWINGS

Other aspects of the present invention will become apparent as the following description proceeds and upon reference to the drawing in which.

Figure 1:
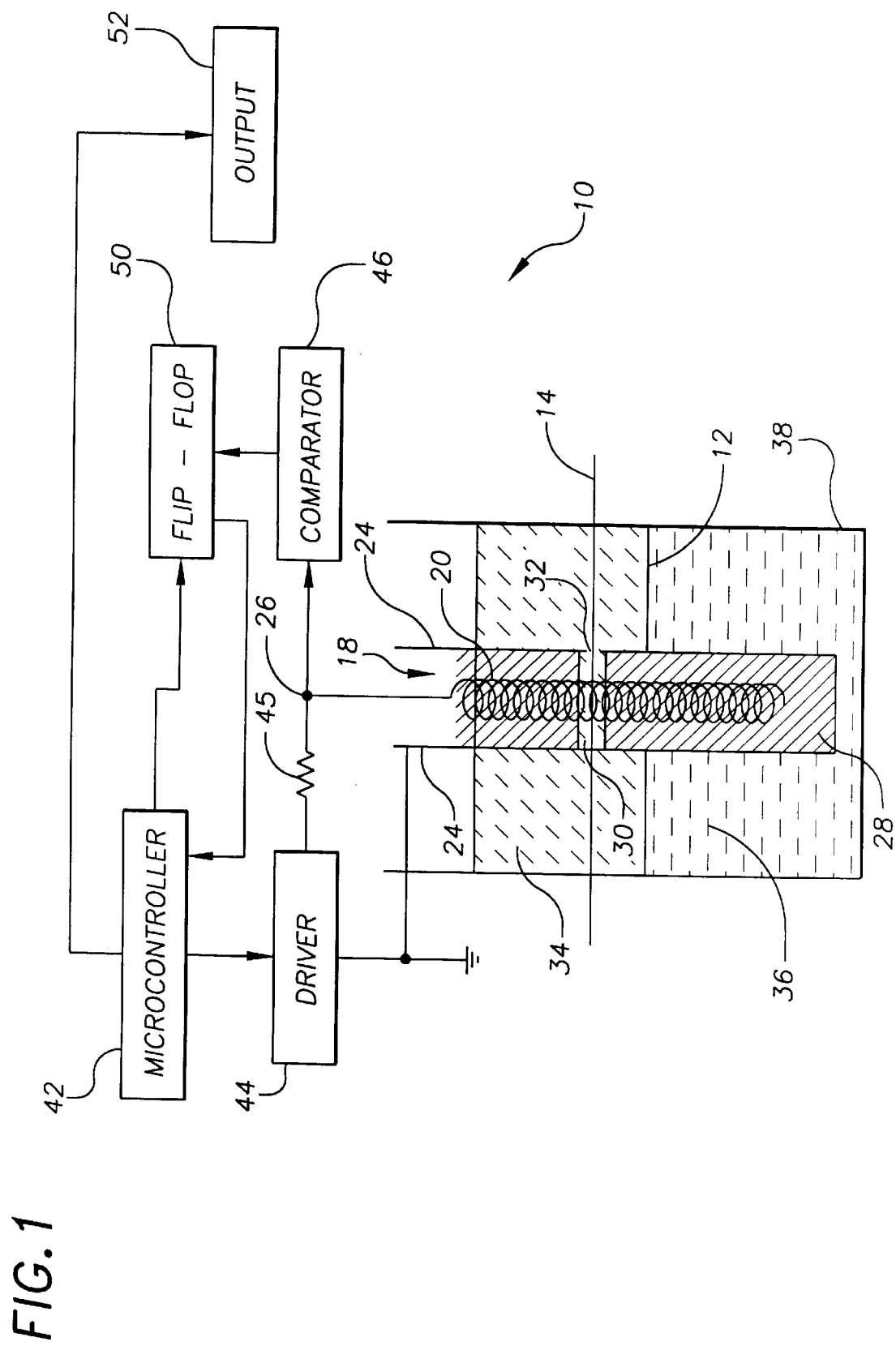
FIG. 1 illustrates a time-domain reflectometry based point level monitoring system which is in accord with the principles of the present invention.

The following text includes directional signals, such as upper, lower, top, and bottom. Those directional signals are taken with respect to the drawing and are meant to aid in understanding the present invention, not to limit it.

DETAILED DESCRIPTION OF THE PREFERRED EMBODIMENT

While the present invention is described in relation to a preferred embodiment time-domain reflectometry based point level monitoring system that senses whether an oil-water interface is above or below a point level, it is to be understood that the principles of the present invention can be implemented in many ways and for many purposes. For example, the present invention can be used to determine whether the position of a liquid-gas interface, such as a water-air interface is above or below a point level. Additionally, while the illustrated embodiment operates by sensing changes in transmission line characteristics caused by changes in permittivity of a material that fills part of the transmission line, the present invention can also operate by sensing changes in other electrical parameters, such as permeability. Finally, while the illustrated embodiment senses only one point level, in other applications it might be beneficial to implement sensing of multiple point levels.

FIG. 1 shows a preferred embodiment time-domain reflectometry based point level monitoring system 10 that monitors whether an oil-water interface 12 is above or below a point level 14. The system 10 includes a slow wave transmission line 18. That transmission line 18 includes a helical winding 20 comprised of closely spaced turns of magnet wire, preferably 40 AWG gauge, copper coated, and insulated with a single build of solderable insulation. For convenience the helical winding is wound on an inner core, which is not shown for simplicity. I currently prefer to use a 14 millimeter outer diameter glass tube for the inner core.

The helical winding 20 is surrounded by a conductive outer shield 24, which is beneficially connected to the system ground. The top end of the helical winding connects to an electrical node 26. Other connections to that node are described subsequently. The outer shield is disposed away from the helical winding such that a gap is formed. That gap is filled with an epoxy resin 28, except at a space 30 that is located at the point level 14. At the space 30 the outer shield has one or more access openings 32 that permit either oil 34 or water 36 to fill the space. The preferred access opening is a conductive screen the electrically connects to the outer shield and that has a mesh fine enough that the electrical properties of the outer shield are retained while permitting either oil and water, depending upon the position of the oil-water interface 12 relative to the point level 14, to fill the space 30. The access opening does not have to completely surround the space 30, but should permit easy entry and exit of oil or water to the space 30.

Several things regarding the transmission line 18 should be understood. First, the wire within the space 30 probably should be protected from the oil and the water. In earlier system that I built the helical winding had a high failure rate, believed to be caused by wire corrosion enabled by pin holes in the wire insulation. After changing wire suppliers the failures stopped. However, I advise coating the wire adjacent the space with either epoxy resin 28 or with an oil and water resistant heat shrink tubing. If epoxy resin is used the epoxy coating should be kept thin. Finally, the height of the space 30 should be kept small so that a narrow "point level" is obtained.

As shown in FIG. 1 the transmission line 18 is inserted into a tank 38 which holds the oil 34 and water 36. The oil floats on the water, forming the interface 12. It should be understood that while the illustrated preferred embodiment senses an oil-water interface 12, the principles of the present invention can be used to sense other interfaces, including gas-liquid interfaces (such as air and water). What is desired is a relatively large difference in the permittivities of the materials that form the interface. It is also desirable that the permittivity of the upper material (oil in FIG. 1) have a permittivity near that of the epoxy.

The system 10 further includes a microcontroller 42 that periodically applies a transmit signal to a driver 44. In response, the driver 44 applies a transmit pulse to the node 26 via a resistor 45. The resistor 45 should have a resistance near that of the impedance of the transmission line 18. Presently I use a driver that outputs transmit pulses which are approximately 750 nanosecond in duration and 5V in height at a repetition rate of about 500 times a second. Those transmit pulses pass through the resistor 45 and propagate down the transmission line 18 until they reach the space 30.

If the oil-water interface 12 is below the space 30 oil fills the space. Since oil has a permittivity somewhat near that of the epoxy resin 28 the oil creates only a small disturbance on the transmission line. Thus either a positive going reflection results, no reflection results, or a small negative going reflection results at the space 30. In any event most of the energy of each the transmit pulse continues propagating down the transmission line toward the bottom end of the helical winding. When a pulse reaches the bottom end a positive reflection occurs that returns to the node 26. That reflection is applied to a comparator 46 that is connected to the node 26. The comparator 46 is designed to change state when a relatively large negative going pulse occurs on the node 26. Therefore, with oil in the space 30 the comparator state does not change.

However, if water fills the space 30 the large permittivity difference between the epoxy resin 28 and the water causes a disturbance on the transmission line 18 that results in a large negative going pulse reflection. That reflection returns to the input node 26 where it causes the comparator 46 to change state. That change of state is applied to a flip-flop 50.

In addition to the state of the comparator 46 the flip-flop 50 also receives a reset pulse from the microcontroller 42. In operation, at about the time the microcontroller sends a transmit signal to the driver 44 the microcontroller causes the flip-flop 50 to be in a known state. That state is held for some period of time to enable the transmission line pulse to be impressed on the transmission line and to travel at least part of the way to the trip level 14. The reset pulse is then removed to allow any change of state of the comparator to cause the flip-flop to change state. After a period of time sufficient for a reflection to be received at the comparator from the point level 14 the microcontroller reads the state of the flip-flop. If the flip-flop has changed state the microcontroller signals that water is at or above the point level 14 by controlling an output device 52, such as a high level alarm, to output a signal.

The flip-flop 50 remembers whether the comparator sensed a large negative going reflection from water. If the microcontroller was directly tied to the comparator the microcontroller, which is a rather slow device, may not sense the narrow pulse from the comparator. Furthermore, the use of the flip-flop enables signals from the comparator to be "gated" in that the flip-flop reset can be removed about the time a negative pulse is expected. This would reduce the occurrence of false gating on noise signals. However, designs can be implemented such that the flip-flop is not required.

A useful modification can be made to the operation described above. In practice an oil-water interface is not perfectly level, an emulsion forms. Furthermore, the trip level 14 is not truly discrete, it represent a span of some distance. Therefore, in practice a slowly changing oil-water interface will sometimes cause the comparator to change state, but at other times the comparator will not. To prevent the output device 52 from toggling at a rapid rate the microcontroller can be programmed to determine the number of changes of state of the comparator after a large number of transmit pulses (say 100). Then the output device can be controlled such that only a large change in the number of changes of state of the comparator would cause the output device to change its output. For example, the microcontroller could be programmed such that after 30 changes of state of the comparator occur per 100 transmit pulses that the output device will only change state when at least 70 changes of state of the comparator occur per 100 transmit pulses (and visa versa).

While the foregoing figure and the above description illustrate the present invention, it is to be understood that they are exemplary only. Others who are skilled in the applicable arts will recognize numerous modifications and adaptations of the illustrated embodiment which will remain within the principles of the present invention. Therefore, the present invention is to be limited only by the appended claims.

What I claim is:

1. A material sensing system, comprising:
   a transmission line including a first conductor, an insulating encapsulating material on said first conductor except at a sensing space, and a second conductor that is spaced apart from said first conductor and that cooperates with said first conductor to propagate electrical signals, wherein said transmission line permits a material being sensed to contact said sensing space;

a transmitter operatively connected to said transmission line for impressing transmit signals onto said transmission line; and an electronic network operatively connected to said transmission line for receiving reflections of said transmit signals from said sensing space, wherein said reflections have amplitudes that depend upon whether a material being sensed is in contact with said sensing space, said electronic network further used for determining whether a material being sensed is in contact with said sensing space based upon said amplitudes.

2. The material sensing system according to claim 1, wherein said first conductor is helically wound around a core.

3. The material sensing system according to claim 1, wherein said second conductor includes an elongated, cylindrical shaped conductor.

4. The material sensing system according to claim 2, wherein said encapsulating material includes a plastic.

5. The material sensing system according to claim 4, wherein said encapsulating material is heatshrink tubing.

6. The material sensing system according to claim 1, wherein said transmit signals are electrical pulses.

7. The material sensing system according to claim 1, wherein a material being sensed is water.

8. A material sensing system, comprising:

a transmission line including a first conductor, an encapsulating insulating material on said first conductor except at a sensing space, and a second conductor that is spaced apart from said first conductor and that cooperates with said first conductor to propagate electrical signals, wherein said transmission line permits a material being sensed to contact said sensing space and wherein said sensing space divides said transmission line into a first section and a second section;

a transmitter operatively connected to said first section of said transmission line, said transmitter for impressing transmit signals onto said transmission line; and an electronic network operatively connected to said second section of said transmission line, said electronic network for receiving said transmit signals after they propagate through at least a portion of said sensing space, wherein said received transmit signals have amplitudes that depend upon whether a material being sensed is in contact with said sensing space, said electronic network further used for determining whether a material being sensed is in contact with said sensing space based upon said amplitudes.

9. The material sensing system according to claim 8, wherein said first conductor is helically wound around a core.

10. The material sensing system according to claim 8, wherein said second conductor includes an elongated, cylindrical shaped conductor.

11. The material sensing system according to claim 9, wherein said encapsulating material includes a plastic.

12. The material sensing system according to claim 11, wherein said encapsulating material is heatshrink tubing.

13. The material sensing system according to claim 8, wherein a material being sensed is water.

14. A sensing system for determining whether water or a hydrocarbon is at a particular level, comprising:

an elongated transmission line including a first conductor, an insulating encapsulating material on said first conductor except at a sensing space, and a second conductor that is spaced apart from said first conductor and that cooperates with said first conductor to propagate electrical signals, wherein said transmission line permits a material being sensed to contact said sensing space and wherein said sensing space is at the particular level;

a transmitter operatively connected to said transmission line for impressing transmit signals onto said transmission line; and an electronic network operatively connected to said transmission line, said network receiving signals from said transmission line that have amplitudes that depend upon whether water or a hydrocarbon predominate at the particular level, said electronic network further used for determining whether water or a hydrocarbon predominate at the particular level based upon said amplitudes.

15. The sensing system according to claim 14, wherein said first conductor is helically wound.

16. The sensing system according to claim 13, wherein said received signals are reflections from said sensing space.

17. The sensing system according to claim 14, further including an output device for signaling whether water is at the particular level.

18. The sensing system according to claim 14, wherein said encapsulating material includes a plastic.

19. The sensing system according to claim 18, wherein said encapsulating material is heatshrink tubing.

20. The sensing system according to claim 14, wherein said electronic network includes a comparator.

* * * * *